(12) United States Patent
Ying et al.

(10) Patent No.: US 11,825,664 B2
(45) Date of Patent: Nov. 21, 2023

(54) MEMORY DEVICE AND SEMICONDUCTOR DIE, AND METHOD OF FABRICATING MEMORY DEVICE

(71) Applicant: Taiwan Semiconductor Manufacturing Company, Ltd., Hsinchu (TW)

(72) Inventors: Ji-Feng Ying, Hsinchu (TW); Jhong-Sheng Wang, Taichung (TW); Tsann Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/703,923

(22) Filed: Mar. 24, 2022

(65) Prior Publication Data
US 2022/0216269 A1    Jul. 7, 2022

Related U.S. Application Data

(63) Continuation of application No. 16/739,016, filed on Jan. 9, 2020, now Pat. No. 11,289,538.

(60) Provisional application No. 62/880,643, filed on Jul. 30, 2019.

(51) Int. Cl.
| | | |
|---|---|---|
| *H10B 61/00* | (2023.01) | |
| *H10N 50/80* | (2023.01) | |
| *H01L 23/528* | (2006.01) | |
| *H01F 10/32* | (2006.01) | |
| *H01L 23/522* | (2006.01) | |
| *H01F 41/32* | (2006.01) | |
| *G11C 11/16* | (2006.01) | |
| *H10N 50/01* | (2023.01) | |

(52) U.S. Cl.
CPC ............ *H10B 61/22* (2023.02); *G11C 11/161* (2013.01); *H01F 10/329* (2013.01); *H01F 10/3259* (2013.01); *H01F 41/32* (2013.01); *H01L 23/528* (2013.01); *H01L 23/5226* (2013.01); *H10N 50/01* (2023.02); *H10N 50/80* (2023.02)

(58) Field of Classification Search
CPC . H01L 27/228; H01L 23/5226; H01L 23/528; H01L 43/02; H01L 43/08; H01L 43/12; G11C 11/161; G11C 11/1659; G11C 11/1675; H01F 10/3259; H01F 10/329; H01F 41/32; H10B 61/22; H10N 50/80; H10N 50/01
USPC ........................................... 257/427
See application file for complete search history.

(56) References Cited

U.S. PATENT DOCUMENTS 9,858,975 B1 * 1/2018 Hatcher .............. G11C 11/1675

* cited by examiner

*Primary Examiner* — Tu-Tu V Ho
(74) *Attorney, Agent, or Firm* — JCIPRNET

(57) ABSTRACT

A memory device including bit lines, auxiliary lines, selectors, and memory cells is provided. The word lines are intersected with the bit lines. The auxiliary lines are disposed between the word lines and the of bit lines. The selectors are inserted between the bit lines and the auxiliary lines. The memory cells are inserted between the word lines and the auxiliary lines.

20 Claims, 14 Drawing Sheets

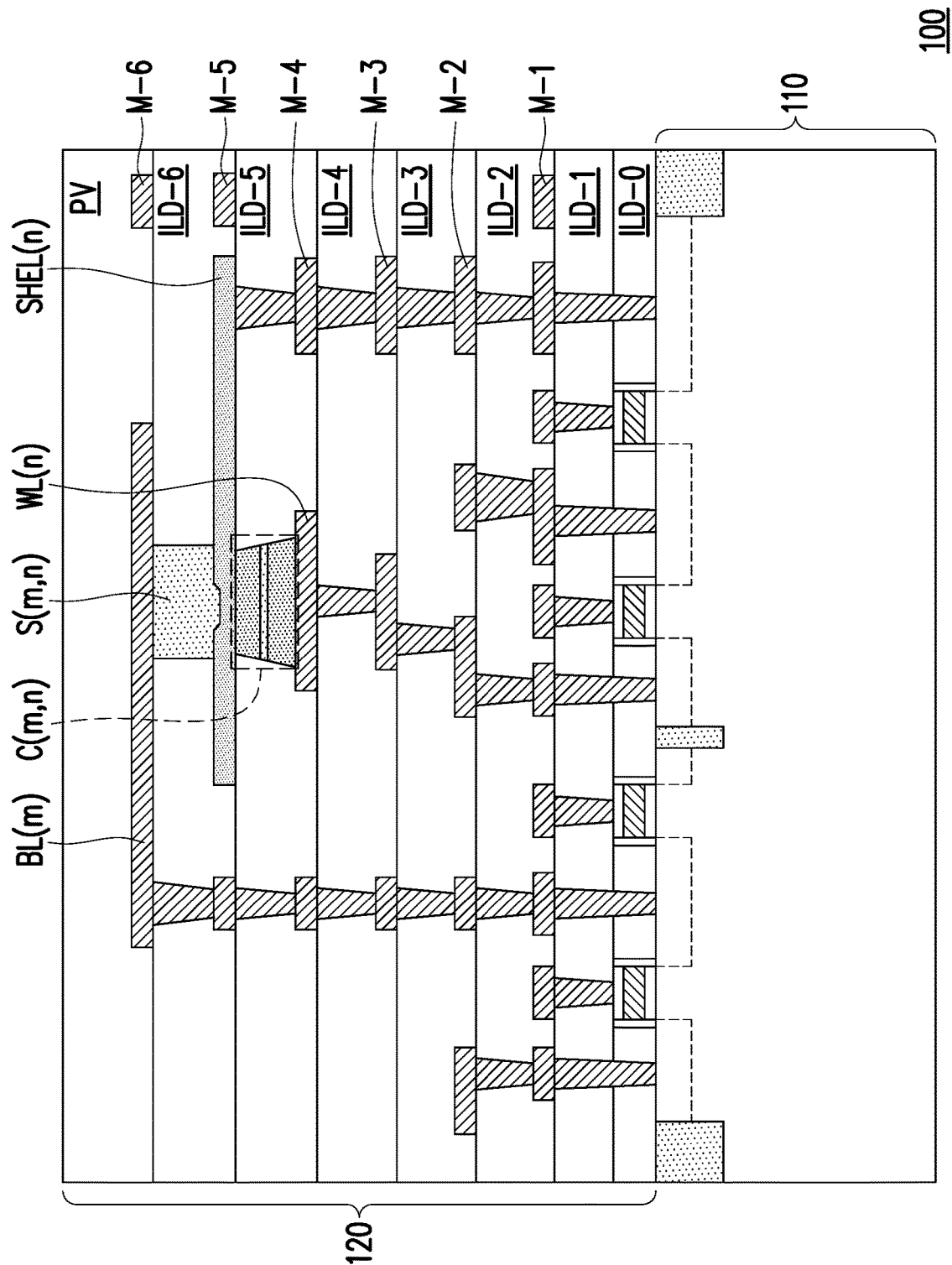

MEMORY DEVICE AND SEMICONDUCTOR DIE, AND METHOD OF FABRICATING MEMORY DEVICE

CROSS REFERENCE AND PRIORITY CLAIM

This application a continuation application of and claims the priority benefit of U.S. application Ser. No. 16/739,016, filed on Jan. 9, 2020, now allowed. The U.S. application Ser. No. 16/739,016 claims the priority benefit of the provisional application Ser. No. 62/880,643 filed at the United States Patent and Trademark Office on Jul. 30, 2019, the entire disclosure of which is herein incorporated by reference.

BACKGROUND

Some integrated circuit manufacturing processes include manufacturing steps associated with making data storage circuit elements. Data storage elements such as Dynamic Random Access Memory (DRAM), Static Random Access Memory (SRAM), flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 3H are cross-sectional views for illustrating a fabricating process of the semiconductor die illustrated in FIG. 2, in accordance with some embodiments.

DETAILED DESCRIPTION

Figure 1:
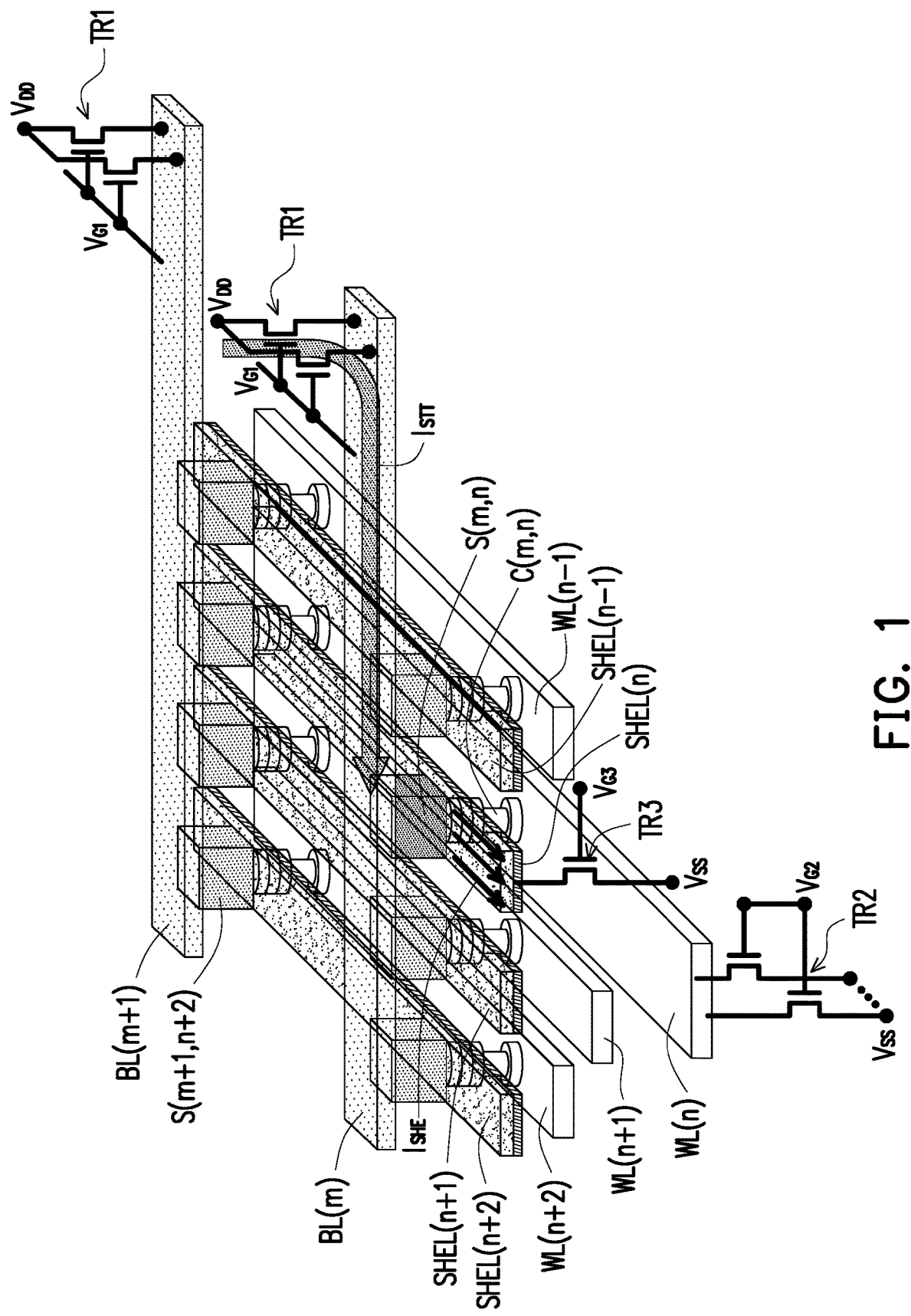
FIG. 1 schematically illustrates a perspective view of a memory device including spin-orbit torque (SOT) MRAM cells arranged in array, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random access memory (MRAM) cell is a form of data storage element for integrated circuits. In comparison with other devices, MRAM cell uses small amounts of power to read and write data. MRAM also has long data retention times in comparison with other devices. In some embodiments, MRAM cells have multi-year data retention times, while the power consumption for reading and writing data is similar to single read or write operations for dynamic random access memory (DRAM) cells. However, in contrast to DRAM cells, MRAM cells are able to store data without regular refreshing of cells in order to preserve stored data.

MRAM cells include magnetic tunnel junctions (MTJs) that enable the use of tunneling magnetoresistance (TMR) to determine the information state of an MRAM cell. A magnetic tunnel junction includes a stack of at least three layers, including a dielectric tunneling barrier layer and two ferromagnetic layers separated by the dielectric tunneling barrier layer. The two ferromagnetic layers includes a reference layer (also called a magnetic pinned layer) and a free layer (also called a magnetic storage layer). The reference layer has a layer of magnetizable material with a locked magnetic field orientation, and the free layer has a layer of magnetizable material where the magnetic field orientation changes between different orientations.

When the magnetic field of the reference layer and the free layer are aligned having the same orientation, the MRAM cell allows a large amount of current to flow in comparison to the allowed amount of current flowing through the MRAM cell when the magnetic field of the reference layer and the magnetic field of the free layer have opposite orientations. The different amounts of current are associated with different information states (e.g., a high amount of current is associated with a "1" bit, and a low amount of current is associated a "0" bit, or vice versa) of the MRAM cell.

MRAM cells are of increasing interest in integrated circuit and semiconductor manufacturing because the magnetic fields of MRAM cells are able to provide long-term data storage. In some embodiments, the magnetization of the reference layer and/or the free layer of an MTJ in an MRAM cell retain the magnetic field orientations associated with a stored bit of information for up to several years, or longer, before thermally-induced field flipping occurs. The read time and the write time of MRAM cells are fast (on the order of DRAM cell reading speed), but the data retention time is at orders of magnitude longer than data retention time of DRAM cells without refreshing.

A stored bit of information may be written into the free layer by applying charge current passing through an MTJ of an MRAM cell. The applied charge current passing through the reference layer becomes spin polarized and exerts a torque on the free layer. The direction of the applied charge current and magnetization of the reference layer determines the direction of generated torque. A large enough torque can switch the magnetic field of the free layer. When performing a "write" procedure of the MRAM cell, a bidirectional charge current is required to determine the information state (i.e. magnetic field) of the free layer such that a "0" bit or a "1" bit may be stored in the MTJ of the MRAM cell.

FIG. 1 schematically illustrates a perspective view of a memory device including spin-orbit torque (SOT) MRAM cells arranged in array, in accordance with some embodiments.

Referring to FIG. 1, the memory device includes a plurality of bit lines, a plurality of word lines, a plurality of Spin Hall Effect (SHE) lines, a plurality of selectors, and a plurality of SHE-assisted SOT-MRAM cells arranged in array. The bit lines may include bit line BL(1), bit line BL(2), . . . , bit line BL(m) and bit line BL(m+1). The bit line BL(1) and the bit line BL(2) are not illustrated in FIG. 1 for simplicity. The number of the bit lines may be modified based on design requirements (e.g., memory capacity, process capability, and so on) of the memory device and not limited in the present invention. In some embodiments, the bit line BL(1), the bit line BL(2), . . . , the bit line BL(m) and the bit line BL(m+1) are substantially paralleled with one another. In some embodiments, each bit line among the bit line BL(1), the bit line BL(2), . . . , the bit line BL(m) and the bit line BL(m+1) is electrically coupled to a relative high voltage level $V_{DD}$ through a group of transistors TR1 coupled in parallel. The voltage level $V_{DD}$ applied to and current flowing through the bit line BL(1), the bit line BL(2), . . . , the bit line BL(m) and the bit line BL(m+1) may be individually controlled by respective groups of transistors TR1 which are electrically coupled to the bit line BL(1), the bit line BL(2), . . . , the bit line BL(m) and the bit line BL(m+1). Each group of transistors TR1 electrically coupled to the bit line BL(1), the bit line BL(2), . . . , the bit line BL(m) and the bit line BL(m+1) may be individually turned on by applying a gate voltage $V_{G1}$ to gates of each group of transistors TR1.

The word lines may include word line WL(1), word line WL(2), . . . , word line WL(n−1), word line WL(n), word line WL(n+1) and word line WL(n+2). The word line WL(1) and the word line WL(2) are not illustrated in FIG. 1 for simplicity. The number of the word lines may be modified based on design requirements (e.g., memory capacity, process capability, and so on) of the memory device and not limited in the present invention. In some embodiments, the word line WL(1), the word line WL(2), . . . , the word line WL(n−1), the word line WL(n), the word line WL(n+1) and the word line WL(n+2) are substantially paralleled with one another. Furthermore, the extending direction of the bit line BL(1), the bit line BL(2), . . . , the bit line BL(m) and the bit line BL(m+1) may be substantially perpendicular to the extending direction of the word line WL(1), the word line WL(2), . . . , the word line WL(n−1), the word line WL(n), the word line WL(n+1) and the word line WL(n+2).

In some embodiments, each bit line among the word line WL(1), the word line WL(2), . . . , the word line WL(n−1), the word line WL(n), the word line WL(n+1) and the word line WL(n+2) is electrically coupled to a relative low voltage level $V_{SS}$ (e.g., ground) through a group of transistors TR2 coupled in parallel. The voltage level $V_{SS}$ applied to and current flowing through the word line WL(1), the word line WL(2), . . . , the word line WL(n−1), the word line WL(n), the word line WL(n+1) and the word line WL(n+2) may be individually controlled by respective groups of transistors TR2 which are electrically coupled to the word line WL(1), the word line WL(2), . . . , the word line WL(n−1), the word line WL(n), the word line WL(n+1) and the word line WL(n+2). Each group of transistors TR2 electrically coupled to the word line WL(1), the word line WL(2), . . . , the word line WL(n−1), the word line WL(n), the word line WL(n+1) and the word line WL(n+2) may be individually turned on by applying a gate voltage $V_{G2}$ to gates of each group of transistors TR2.

The auxiliary lines may include auxiliary line SHEL(1), auxiliary line SHEL(2), auxiliary line SHEL(n−1), auxiliary line SHEL(n), auxiliary line SHEL(n+1) and auxiliary line SHEL(n+2). The auxiliary line SHEL(1) and the auxiliary line SHEL(2) are not illustrated in FIG. 1 for simplicity. The number of the auxiliary lines may be modified based on design requirements (e.g., memory capacity, process capability, and so on) of the memory device and not limited in the present invention. In some embodiments, the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2) are substantially paralleled with one another. In some embodiments, the extending direction of the word line WL(1), the word line WL(2), . . . , the word line WL(n−1), the word line WL(n), the word line WL(n+1) and the word line WL(n+2) are substantially paralleled with the extending direction of the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2). Furthermore, the extending direction of the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2) may be substantially perpendicular to the extending direction of the bit line BL(1), the bit line BL(2), . . . , the bit line BL(m) and the bit line BL(m+1).

In some embodiments, each auxiliary line among the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2) is electrically coupled to a relative low voltage level $V_{SS}$ (e.g., ground) through a group of transistors TR3 coupled in parallel. The voltage level $V_{SS}$ applied to and current flowing through the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2) may be individually controlled by respective groups of transistors TR3 which are electrically coupled to the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2). Each group of transistors TR3 electrically coupled to the auxiliary line SHEL(1), the auxiliary line SHEL(2), . . . , the auxiliary line SHEL(n−1), the auxiliary line SHEL(n), the auxiliary line SHEL(n+1) and the auxiliary line SHEL(n+2) may be individually turned on by applying a gate voltage $V_{G3}$ to gates of each group of transistors TR3.

The selectors may include selector S(1, 1), ..., selector S(m, n), ..., and selector S(m+1, n+2). Only the selector S(m, n) is illustrated in FIG. 1 for simplicity. The number of the selectors may be determined by the numbers of the bit lines, words lines, and/or auxiliary lines, which may be modified based on design requirements (e.g., memory capacity, process capability, and so on) of the memory device. The number of the selectors is not limited in the present invention. Although not illustrated in FIG. 1, the selector S (1, 1) is a selector disposed between the bit line BL(1) and the auxiliary line SHEL(1). As illustrated in FIG. 1, the selector S(m, n) is a selector disposed between the bit line BL(m) and the auxiliary line SHEL(n), and the selector S(m+1, n+2) is a selector disposed between the bit line BL(m+1) and the auxiliary line SHEL(n+2). In some embodiments, the selector S(m, n) is a diode and may be turned on by a forward bias. The selector S(m, n) may be indium zinc oxide (IZO) diode disposed between and electrically coupled to the bit line BL(m) and the auxiliary line SHEL(n). The selector S(m, n) may be selected and turned on by a forward bias (e.g., a difference between voltage level $V_{DD}$ and voltage level $V_{SS}$) applied by the bit line BL(m) and the auxiliary line SHEL(n).

The SHE-assisted SOT-MRAM cells may include SHE-assisted SOT-MRAM cell C(1, 1), ..., SHE-assisted SOT-MRAM cell C(m, n), ..., and SHE-assisted SOT-MRAM cell C(m+1, n+2) arranged in array. Only the SHE-assisted SOT-MRAM cell C(m, n) is illustrated in FIG. 1 for simplicity. The number of the SHE-assisted SOT-MRAM cells may be determined by the numbers of the bit lines, words lines, and/or auxiliary lines, which may be modified based on design requirements (e.g., memory capacity, process capability, and so on) of the memory device. The number of the SHE-assisted SOT-MRAM cells is not limited in the present invention. Although not illustrated in FIG. 1, the SHE-assisted SOT-MRAM cell C(1, 1) is a cell disposed between the bit line BL(1) and the word line WL(1), and the SHE-assisted SOT-MRAM cell C(1, 1) is disposed between the auxiliary line SHEL(1) and the word line WL(1). As illustrated in FIG. 1, the SHE-assisted SOT-MRAM cell C(m, n) is a cell disposed between the bit line BL(m) and the word line WL(n), and the SHE-assisted SOT-MRAM cell C(m, n) is disposed between the auxiliary line SHEL(n) and the word line WL(n). The SHE-assisted SOT-MRAM cell C(m+1, n+2) is a cell disposed between the bit line BL(m+1) and the word line WL(n+2), and the SHE-assisted SOT-MRAM cell C(m+1, n+2) is disposed between the auxiliary line SHEL(n+2) and the word line WL(n+2). The above-mentioned "m" and "n" are positive integers, wherein the integer m is greater than 2, and the integer n is greater than 2.

In some other embodiments, each of the SHE-assisted SOT-MRAM cell C(1, 1), ..., the SHE-assisted SOT-MRAM cell C(m, n), ..., and the SHE-assisted SOT-MRAM cell C(m+1, n+2) includes a perpendicular MTJ. The MTJ included in each SHE-assisted SOT-MRAM cell may respectively include a reference layer, a free layer disposed over the reference layer and a dielectric tunneling barrier layer disposed between the free layer and the reference layer, wherein the reference layer has a layer of magnetizable material with a locked magnetic field orientation, and the free layer has a layer of magnetizable material where the magnetic field orientation changes between different orientations. In some other embodiments, the MTJ included in each SHE-assisted SOT-MRAM cell may further include other functional layers such as seed layer, anti-pinning layer, spacer layer, and/or keeper. The detailed description of the structure of the MTJ included in each SHE-assisted SOT-MRAM cell will be described in accompany with FIG. 4.

As illustrated in FIG. 1, the word line WL(1), the word line WL(2), ..., the word line WL(n−1), the word line WL(n), the word line WL(n+1) and the word line WL(n+2) may be fabricated by a first patterned conductive wiring layer in an interconnect structure of a semiconductor die. The auxiliary line SHEL(1), the auxiliary line SHEL(2), ..., the auxiliary line SHEL(n−1), the auxiliary line SHEL(n), the auxiliary line SHEL(n+1) and the auxiliary line SHEL(n+2) may be fabricated by a second patterned conductive wiring layer in the interconnect structure of the semiconductor die. The bit line BL(1), the bit line BL(2), ..., the bit line BL(m) and the bit line BL(m+1) may be fabricated by a third patterned conductive wiring layer in the interconnect structure of the semiconductor die. The third patterned conductive wiring layer is disposed above and the second patterned conductive wiring layer, and the second patterned conductive wiring layer is disposed above the first patterned conductive wiring layer. In other words, the second patterned conductive wiring layer is formed between the first patterned conductive wiring layer and the third patterned conductive wiring layer. Furthermore, the first patterned conductive wiring layer is spaced apart from the second patterned conductive wiring layer by a first dielectric layer (not illustrated in FIG. 1), and the second patterned conductive wiring layer is spaced apart from the third patterned conductive wiring layer by a second dielectric layer (not illustrated in FIG. 1). The SHE-assisted SOT-MRAM cell C(1, 1), ..., the SHE-assisted SOT-MRAM cell C(m, n), ..., and the SHE-assisted SOT-MRAM cell C(m+1, n+2) may be formed in the first dielectric layer between the first patterned conductive wiring layer and the second patterned conductive wiring layer, and the selector S(1, 1), ..., the selector S(m, n), ..., and the selector S(m+1, n+2) in the second dielectric layer between the second patterned conductive wiring layer and the third patterned conductive wiring layer.

When a Spin transfer torque (STT) write procedure of the SHE-assisted SOT-MRAM cells C(m, n) is performed, the group of transistors TR1 electrically coupled to the bit line BL(m), the group of transistors TR3 electrically coupled to the auxiliary line SHEL(n), and the group of transistors TR2 electrically coupled to the word line WL(n) are turned on. The selector S(m, n) is selected and turned on because the group of transistors TR2 electrically coupled to the bit line BL(m) and the group of transistors TR2 electrically coupled to the auxiliary line SHEL(n) are turned on. During STT write procedure of the SHE-assisted SOT-MRAM cells C(m, n), an SHE-assisted current $I_{SHE}$ flows through the auxiliary line SHEL(n) horizontally, and the STT write current $I_{STT}$ flows through the bit line BL(m) and the selector S(m, n) vertically such that a bit of information is stored in the SHE-assisted SOT-MRAM cells C(m, n). A stored bit of information may be written into the free layer by applying the STT write current $I_{STT}$ passing through the MTJ in the SHE-assisted SOT-MRAM cells C(m, n). The applied the STT write current $I_{STT}$ passing through the reference layer of the MTJ becomes spin polarized and exerts a torque on the free layer. The direction of the STT write current $I_{STT}$ and magnetization of the reference layer determines the direction of generated torque. The SHE-assisted current $I_{SHE}$ transmitted by the auxiliary line SHEL(n) may create write ability of the SHE-assisted SOT-MRAM cells C(m, n). Furthermore, since the word line and the bit lines are coupled to groups of transistors TR1 and TR2 respectively, the STT write current $I_{STT}$ and the read current utilized in the operation of (i.e. read and write procedures) of the SHE-assisted SOT-MRAM cells may increases so as to improve the operation stability of the SHE-assisted SOT-MRAM cells.

In a read procedure, a sense current flows in the SHE-assisted SOT-MRAM cells C(m, n). When magnetizations of reference and free layers are parallel to each other in the SHE-assisted SOT-MRAM cells C(m, n), the resistance of the SHE-assisted SOT-MRAM cells C(m, n) reaches a minimum value, thereby the sense current reading a "0" code. When both magnetizations are antiparallel to each other in the SHE-assisted SOT-MRAM cells C(m, n), the resistance of the SHE-assisted SOT-MRAM cells C(m, n) reaches a maximum value, thereby the sense current reading a "1" code.

Figure 2:
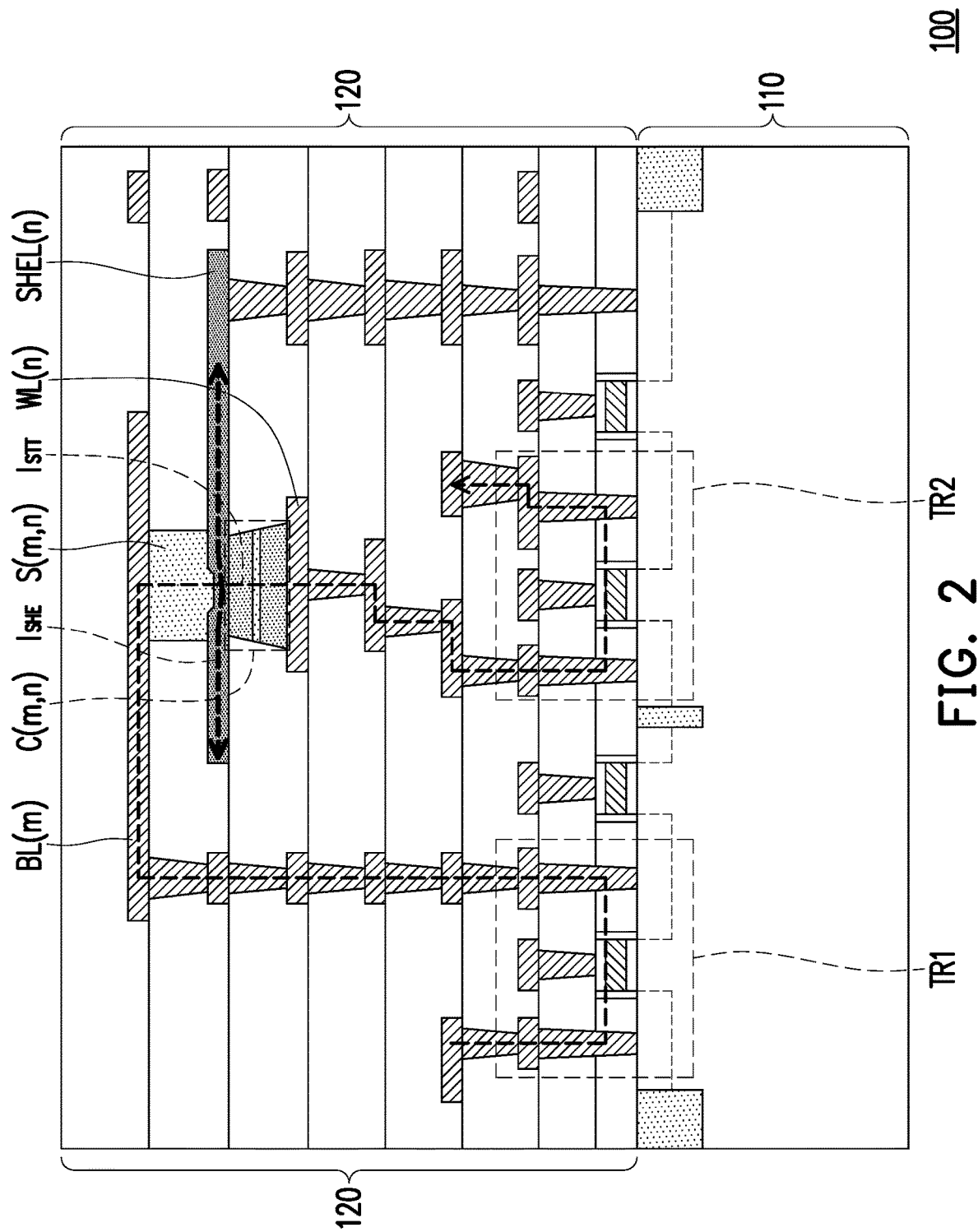
FIG. 2 is a cross-sectional diagram of a semiconductor die including embedded SOT-MRAM cells, in accordance with some embodiments.

FIG. 2 is a cross-sectional diagram of a semiconductor die including embedded SOT-MRAM cells, in accordance with some embodiments. Referring to FIG. 1 and FIG. 2, semiconductor die 100 may include a semiconductor substrate 110 including a plurality of transistors TR1 and a plurality of transistors TR2 formed thereon and an interconnect structure 120 over the semiconductor substrate 110. One transistor TR1 and one transistor TR2 are illustrated in FIG. 2 for simplicity. The transistors TR1 and TR2 formed over the semiconductor substrate 110 may be FinFETs, MOSFETs, GAA nanowire FETs, GAA nanosheet FETs or the like. The interconnect structure 120 may include a plurality of dielectric layers and a plurality of interconnect wirings (e.g., copper wirings). To integrate the memory device illustrated in FIG. 1 into the semiconductor die 100, the bit lines, the word lines, the auxiliary lines, the selectors, and the SHE-assisted embedded SOT-MRAM cells are embedded in the interconnect structure 120. In other words, the formation of the bit lines, the word lines, the auxiliary lines, the selectors, and the SHE-assisted embedded SOT-MRAM cells C(m, n) may be integrated in the fabrication of the interconnect structure 120 of the semiconductor die 100.

As illustrated in FIG. 2, when the STT write procedure of the SHE-assisted SOT-MRAM cells C(m, n) is performed, gate voltage $V_{G1}$ is applied to the gate electrodes of the transistors TR1 and gate voltage $V_{G2}$ is applied to the gate electrodes of the transistors TR2 to turned on the transistors TR1 and TR2 such that the STT write current $I_{STT}$ from a source line may sequentially flow through channel of the transistor TR1, interconnect wirings in the interconnect structure 120, the bit line BL(m), the selector S(m, n), the SHE-assisted embedded SOT-MRAM cells C(m, n), the word line WL(n), and the channel of the transistor TR2. During the STT write procedure of the SHE-assisted SOT-MRAM cells C(m, n), by the assistance of the SHE-assisted current $I_{SHE}$, a bit of information is stored in the SHE-assisted SOT-MRAM cells C(m, n) through STT write mechanism. The detailed fabrication process will be described in accompany with FIG. 3A through FIG. 3H.

FIG. 3A through FIG. 3H are cross-sectional views for illustrating a fabricating process of the semiconductor die 100 illustrated in FIG. 2, in accordance with some embodiments.

Figure 3A:
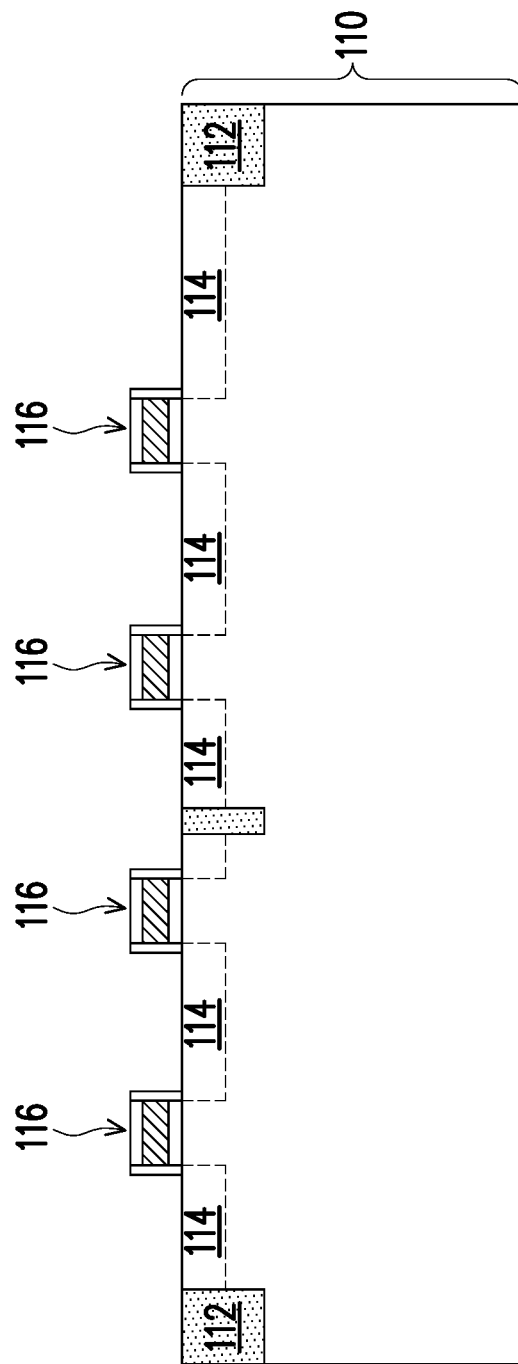

Referring to FIG. 3A, a semiconductor substrate 110 including doped source/drain regions. In some embodiments, the semiconductor substrate 110 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInASP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 110, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 110 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

A plurality of isolation structures 112 may be formed in the semiconductor substrate 110 to define an active area where transistors (TR1, TR2 and TR3) illustrated in FIG. 1 are formed. In some embodiments, source/drain regions 114 and gate structures 116 of the transistors (TR1, TR2 and TR3) may be formed over the semiconductor substrate 100.

Figure 3B:
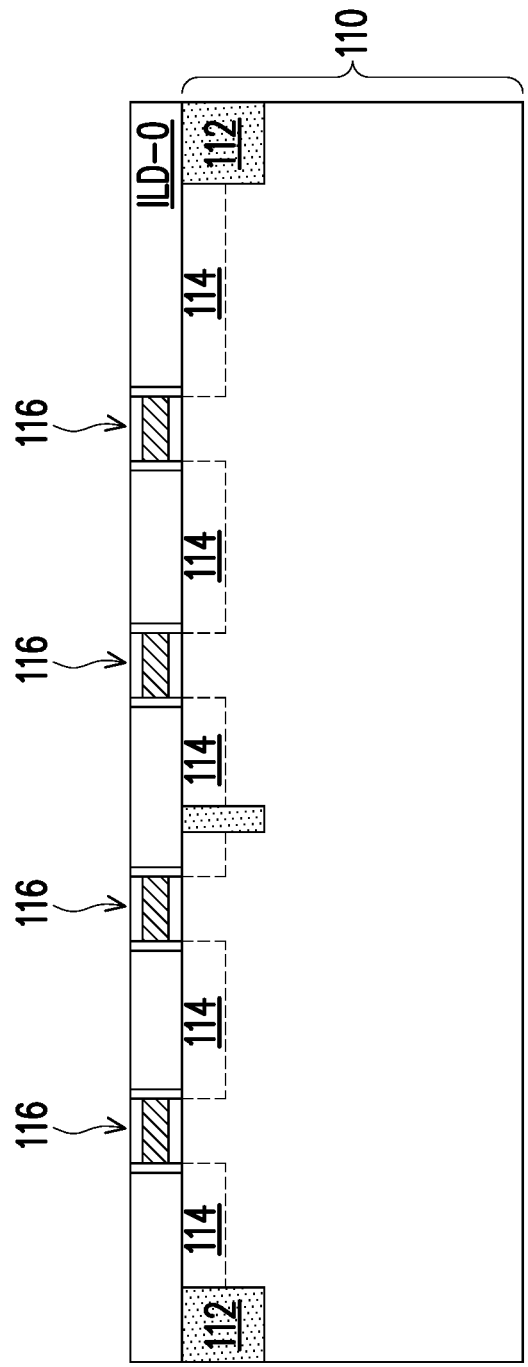

Referring to FIG. 3B, after forming the source/drain regions 114 and gate structures 116 of the transistors (TR1, TR2 and TR3), an interlayer dielectric layer ILD-0 is formed over the semiconductor substrate 110. In some embodiments, the interlayer dielectric layer ILD-0 includes silicon oxide. Alternatively, in some embodiments, the interlayer dielectric layer ILD-0 includes a low-k dielectric material having a dielectric constant (k) less than 4. In some embodiments, the low-k dielectric material has a dielectric constant from about 1.2 to about 3.5. In some embodiments, the interlayer dielectric layer ILD-0 includes tetraethylorthosilicate (TEOS) formed oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the interlayer dielectric layer ILD-0 is deposited by CVD, PECVD, PVD, or spin coating. In some embodiments, the interlayer dielectric layer ILD-0 is deposited to have a top surface above the top surface of the gate structures 116. The interlayer dielectric layer ILD-0 is subsequently planarized, for example, by CMP and/or a recess etch using the gate structures 116 as a polishing and/or etch stop. After the planarization, the interlayer dielectric layer ILD-0 has a surface substantially coplanar with the top surface of the gate structures 116.

Figure 3C:
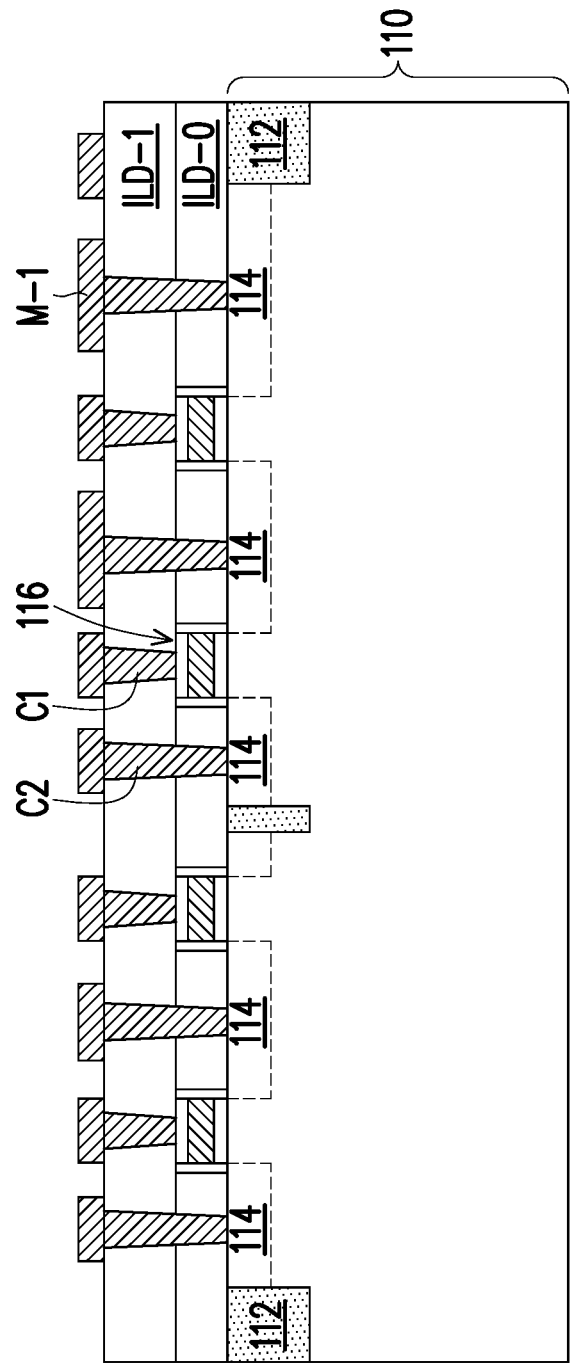

Referring to FIG. 3C, after forming the interlayer dielectric layer ILD-0, an interlayer dielectric layer ILD-1 is formed to cover the interlayer dielectric layer ILD-0. In some embodiments, the interlayer dielectric layer ILD-1 includes silicon oxide. Alternatively, in some embodiments, the interlayer dielectric layer ILD-1 includes a low-k dielectric material having a dielectric constant (k) less than 4. In some embodiments, the low-k dielectric material has a dielectric constant from about 1.2 to about 3.5. In some embodiments, the interlayer dielectric layer ILD-1 includes TEOS formed oxide, undoped silicate glass, or doped silicate glass such as BPSG, FSG, PSG, BSG, and/or other suitable dielectric materials. In some embodiments, the interlayer dielectric layer ILD-1 is deposited by CVD, PECVD, PVD, or spin coating. In some embodiments, the interlayer dielectric layer ILD-1 is deposited to have a top surface. The interlayer dielectric layer ILD-0 and the interlayer dielectric layer ILD-1 are patterned to formed contact openings for exposing portions of the source/drain regions 114. Then, metallic material is formed to cover the interlayer dielectric layer ILD-1 and fill the opening defined in the dielectric layer ILD-0 and the interlayer dielectric layer ILD-1. The metallic material is subsequently patterned, for example, by photolithography and etch processes such that gate contacts C1, source/drain contacts C2, and interconnect wirings M-1 are formed, wherein the interconnect wirings M-1 are formed over the interlayer dielectric layer ILD-1, the gate contacts C1 are in contact with the gate structure 116, and the source-drain contacts C2 are in contact with the source/drain regions 114.

Figure 3D:
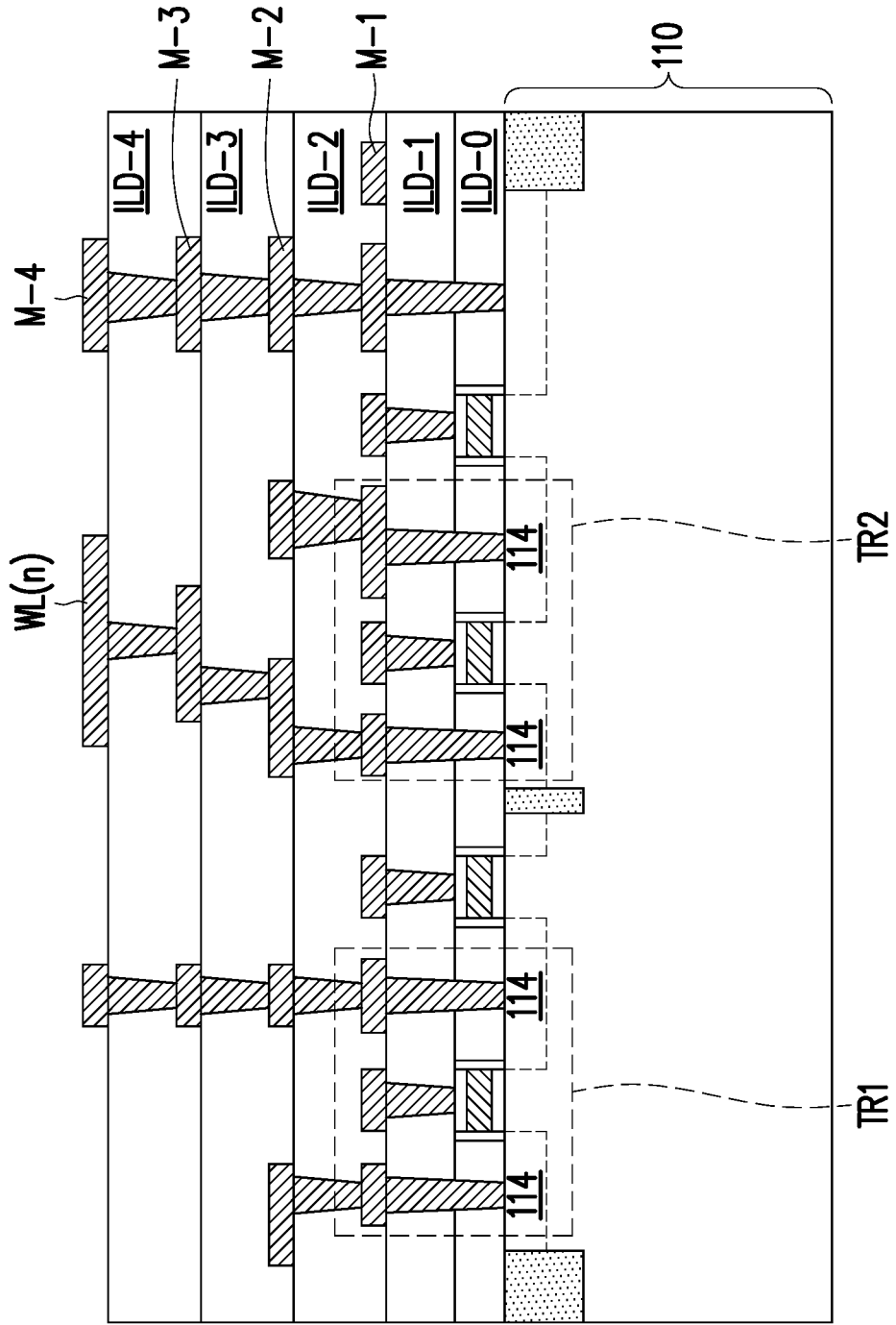

Referring to FIG. 3D, an interlayer dielectric layer ILD-2, interconnect wirings M-2, an interlayer dielectric layer ILD-3, interconnect wirings M-3, an interlayer dielectric layer ILD-4, and interconnect wirings M-4 are sequentially formed over the interlayer dielectric layer ILD-1. The fabrication process of the interlayer dielectric layer ILD-2, the interconnect wirings M-2, the interlayer dielectric layer ILD-3, the interconnect wirings M-3, the interlayer dielectric layer ILD-4, and the interconnect wirings M-4 are similar with the fabrication process of the interlayer dielectric layer ILD-1 and the interconnect wirings M-1. Detailed description related to the fabrication process is thus omitted.

In some embodiments, after forming the interlayer dielectric layer ILD-4 and the interconnect wirings M-4, word lines are formed to electrically connect to the source/drain regions 114 of the transistors TR2. For simplicity, only the word line WL(n) is illustrated in FIG. 3D. In some other embodiments, the word lines are formed by more than four interconnect wirings in the interconnect structure. In some alternative embodiments, the word lines are formed by less than four interconnect wirings in the interconnect structure. The number of the interconnect wirings included in the word lines is not limited in the present invention.

Figure 3E:
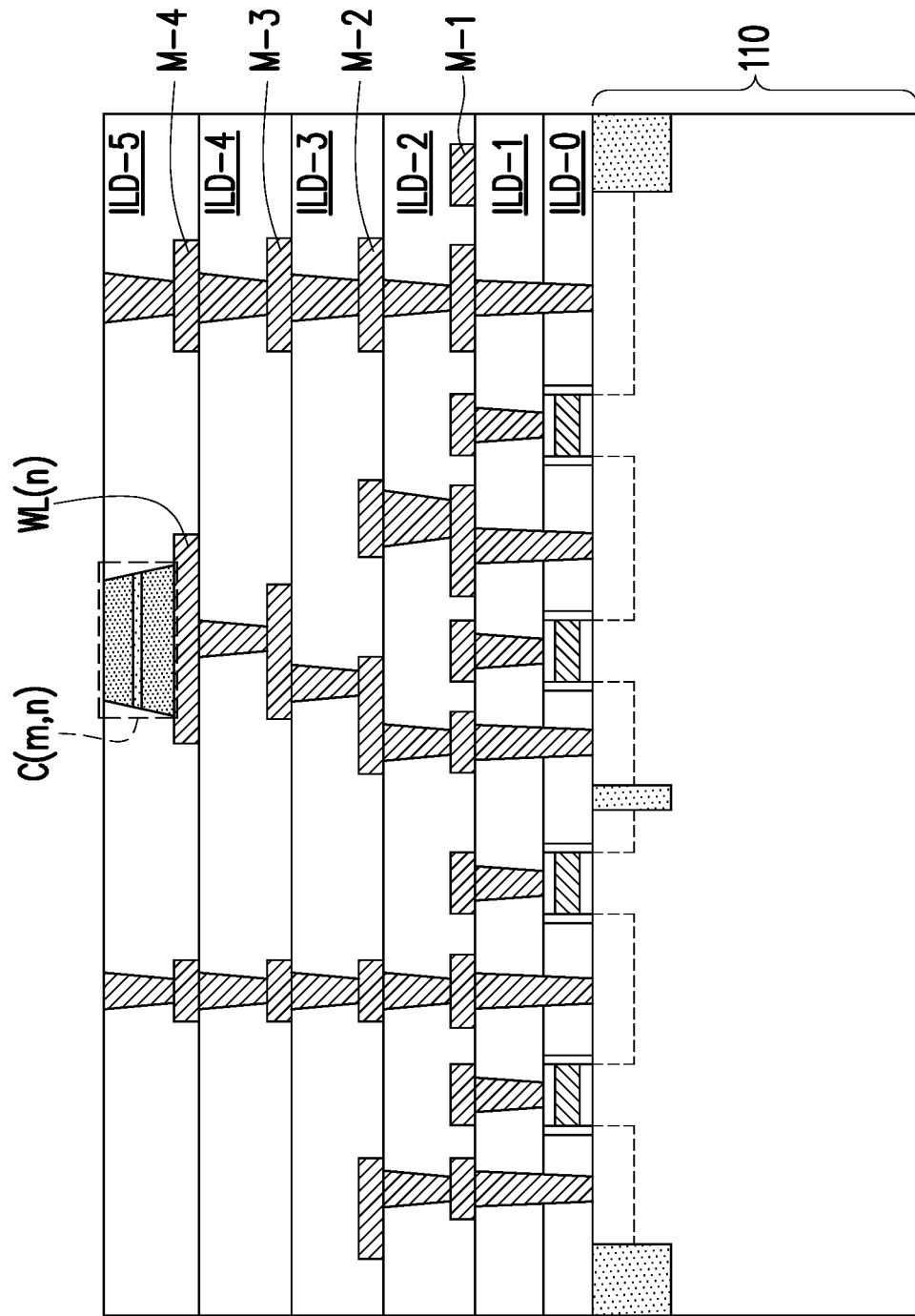

Referring to FIG. 3E, SHE-assisted SOT-MRAM cells arranged in array may be formed on and in contact with the interconnect wirings M-4 such that the SHE-assisted SOT-MRAM cells are formed on and in contact with the respective bit lines. For simplicity, only the word line WL(n) is illustrated in FIG. 3E. Take the SHE-assisted SOT-MRAM cell C(m, n) as an example, the SHE-assisted SOT-MRAM cells C(m, n) is formed on and in contact with the bit line BL(n).

After forming the SHE-assisted SOT-MRAM cell C(m, n), an interlayer dielectric layer ILD-5 is formed over the interlayer dielectric layer ILD-4 to laterally surround the SHE-assisted SOT-MRAM cell C(m, n). The material of the interlayer dielectric layer ILD-5 may be similar with that of the interlayer dielectric layer ILD-0. In some embodiments, the interlayer dielectric layer ILD-5 is deposited by CVD, PECVD, PVD, or spin coating. In some embodiments, the interlayer dielectric layer ILD-5 is deposited to have a top surface above the top surface of the SHE-assisted SOT-MRAM cell C(m, n). The interlayer dielectric layer ILD-5 is subsequently planarized, for example, by CMP and/or a recess etch using a top portion of the SHE-assisted SOT-MRAM cell C(m, n) as a polishing and/or etch stop. After the planarization, the interlayer dielectric layer ILD-5 has a surface substantially coplanar with the top surface of the SHE-assisted SOT-MRAM cell C(m, n).

After forming the SHE-assisted SOT-MRAM cell C(m, n) and the interlayer dielectric layer ILD-5, conductive vias may be formed in the interlayer dielectric layer ILD-5 to electrically connects the interconnect wirings M-4.

Figure 3F:
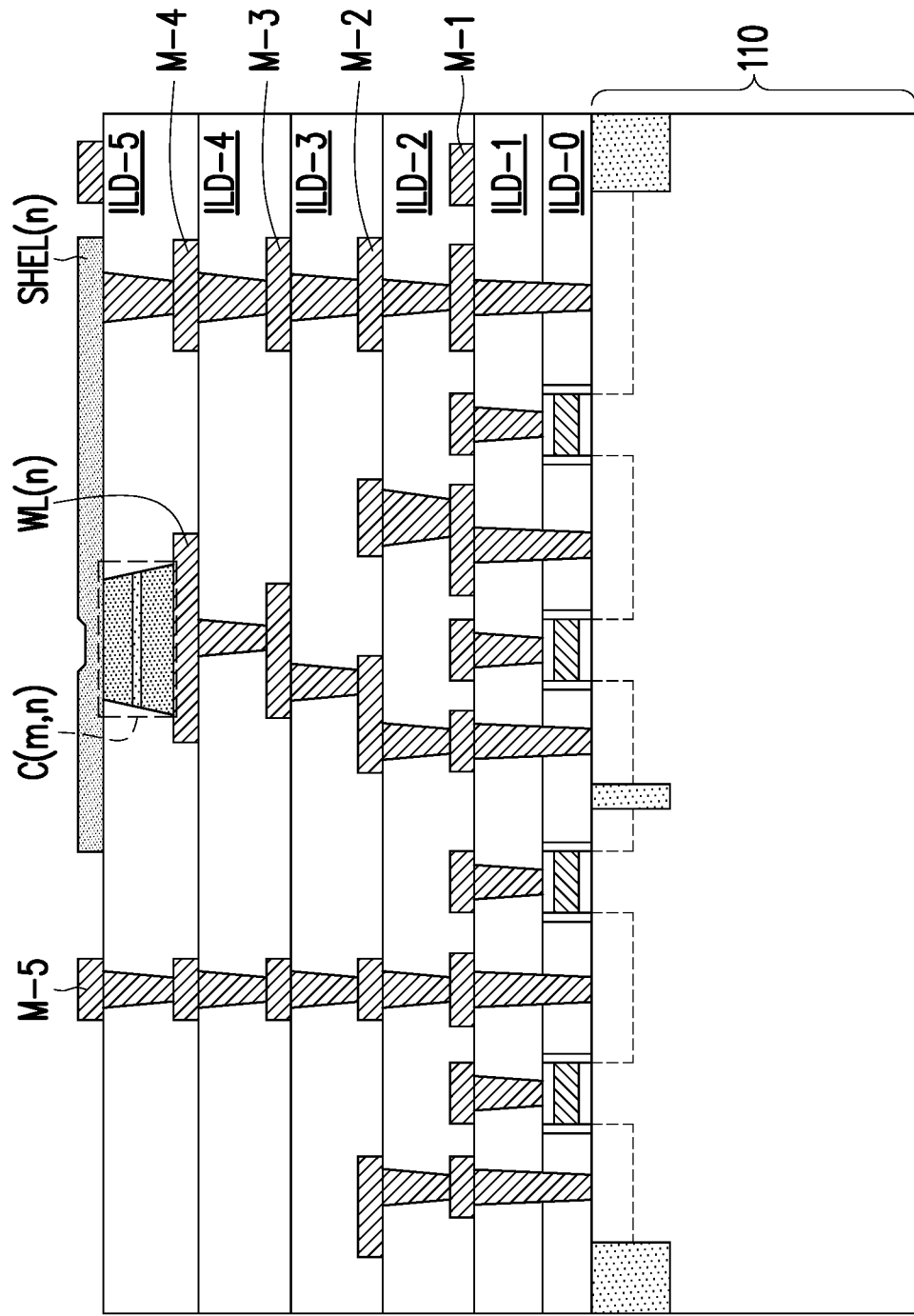

Referring to FIG. 3F, auxiliary lines are formed over the SHE-assisted SOT-MRAM cells. For simplicity, only the auxiliary line SHEL(n) is illustrated in FIG. 3F. In some embodiments, the material of the auxiliary line SHEL(n) includes anti-ferromagnetic materials such as platinum (Pt), tantalum (Ta), tungsten (W), hafnium (Hf), iridium (Ir), osmium (Os), and manganese (Mn), or alloys thereof. The auxiliary line SHEL(n) may be formed by depositing (e.g., by sputtering or electroplating) the above-mentioned anti-ferromagnetic materials over the interlayer dielectric layer ILD-5 followed by a patterning process. The deposited anti-ferromagnetic materials may be subsequently patterned, for example, by photolithography and etch processes to form the auxiliary line SHEL(n).

In some embodiments, interconnect wirings M-5 are formed over the interlayer dielectric layer ILD-5 after forming the auxiliary line SHEL(n), and the material of the interconnect wirings M-5 are identical with or different from that of the auxiliary line SHEL(n). In some other embodiments, interconnect wirings M-5 are formed over the interlayer dielectric layer ILD-5 before forming the auxiliary line SHEL(n), and the material of the interconnect wirings M-5 are identical with or different from that of the auxiliary line SHEL(n). In some alternative embodiments, the auxiliary line SHEL(n) and the interconnect wirings M-5 are formed by the same series of processes (e.g., deposition of anti-ferromagnetic materials followed by photolithography and etch processes), and the material of the interconnect wirings M-5 are identical with that of the auxiliary line SHEL(n).

Figure 3G:
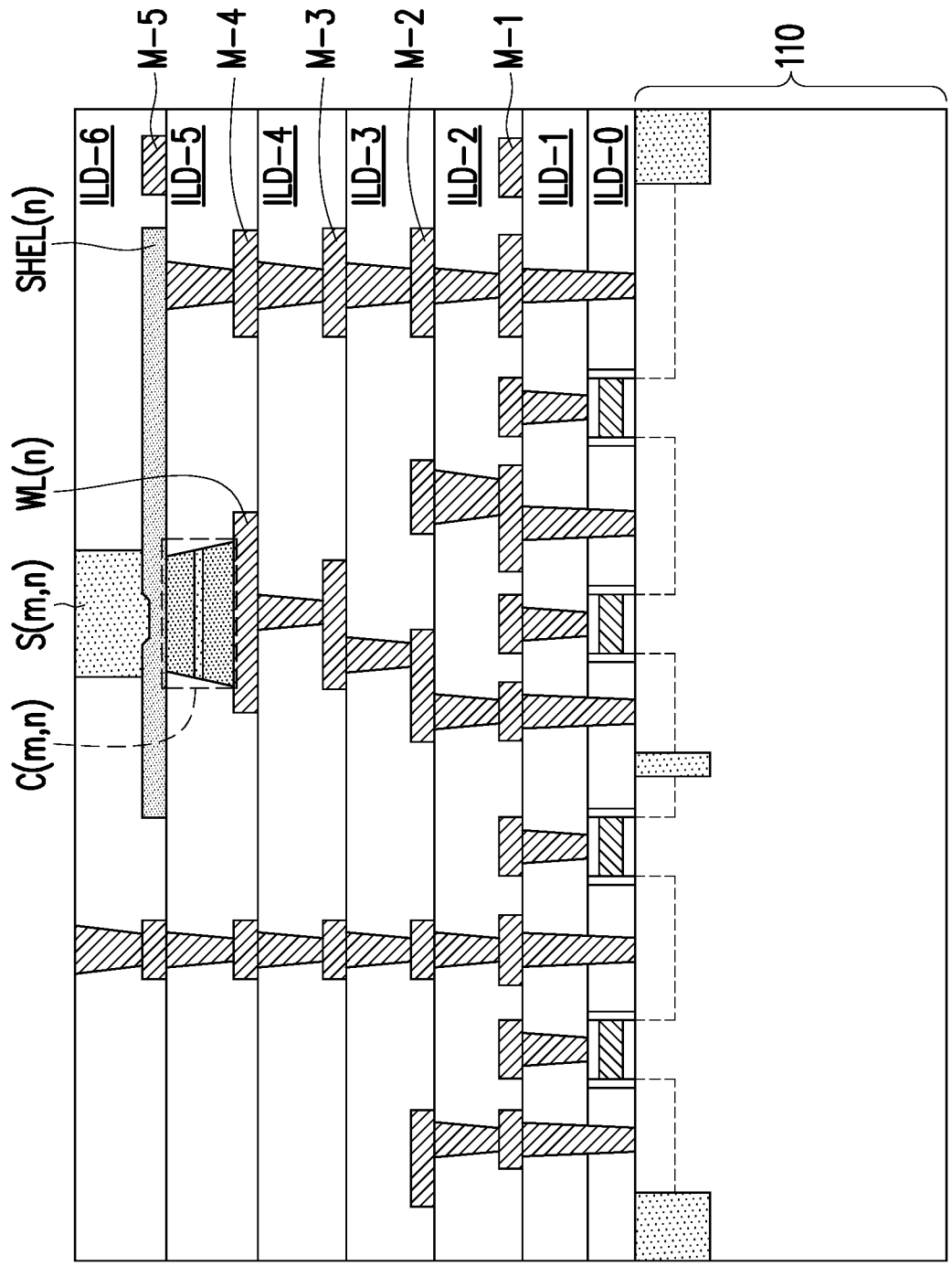

Referring to FIG. 3G, selectors are formed over the auxiliary lines. For simplicity, only the selector S(m, n) is illustrated in FIG. 3G. In an embodiment in which the selector S(m, n) is an IZO diode, the IZO diode may be formed by depositing IZO material followed by a patterning process. IZO material may be deposited over the interconnect wirings M-5 and the interlayer dielectric layer ILD-5, and may be then patterned, for example, by photolithography and etch processes to form the selector S(m, n) over the interconnect wirings M-5.

After forming the selector S(m, n), an interlayer dielectric layer ILD-6 is formed over the interlayer dielectric layer ILD-5 to laterally surround the interconnect wirings M-5. The material of the interlayer dielectric layer ILD-6 may be similar with that of the interlayer dielectric layer ILD-5. In some embodiments, the interlayer dielectric layer ILD-6 is deposited by CVD, PECVD, PVD, or spin coating. In some embodiments, the interlayer dielectric layer ILD-6 is deposited to have a top surface above the top surface of the selector S(m, n). The interlayer dielectric layer ILD-6 is subsequently planarized, for example, by CMP and/or a recess etch using a top portion of the selector S(m, n) as a polishing and/or etch stop. After the planarization, the interlayer dielectric layer ILD-6 has a surface substantially coplanar with the top surface of the selector S(m, n).

After forming the selector S(m, n) and the interlayer dielectric layer ILD-6, conductive vias may be formed in the interlayer dielectric layer ILD-6 to electrically connects the interconnect wirings M-5. In some embodiments, the conductive vias are formed in the interlayer dielectric layer ILD-6 after forming the selector S(m, n). In some other embodiments, the conductive vias are formed in the interlayer dielectric layer ILD-6 before forming the selector S(m, n).

Referring to FIG. 3H, interconnect wirings M-6 are formed over the interlayer dielectric layer ILD-6, and the material of the interconnect wirings M-6 is identical with or different from that of the interconnect wirings M-5. After forming the interconnect wirings M-6, a passivation layer PV is formed over the interlayer dielectric layer ILD-6 to cover the interconnect wirings M-6. In some embodiments, the passivation layer PV includes silicon oxide, silicon nitride or the like. The passivation layer PV may be deposited by CVD, PECVD, PVD, or spin coating.

Figure 4:
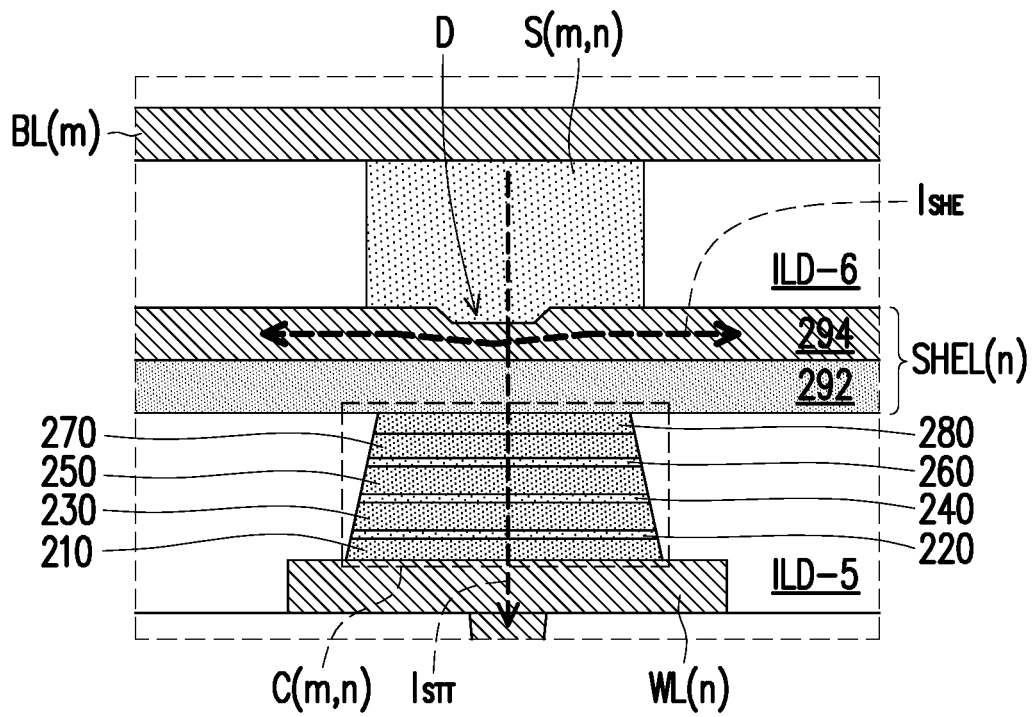
FIG. 4 is a cross-sectional of an embedded SOT-MRAM cell and a selector over the SOT-MRAM cell, in accordance with some embodiments.

FIG. 4 is a cross-sectional view of an embedded SOT-MRAM cell and a selector over the SOT-MRAM cell, in accordance with some embodiments. Referring to FIG. 4, in some other embodiments, the SHE-assisted SOT-MRAM cell C(m, n) may include a buffer layer 210 over the word line WL(n), a seed layer 220 over the buffer layer 210, a hard-biasing layers 230 over the seed layer 220, an antiparallel coupling (APC) layer 240 over the hard-biasing layer 230, at least one reference layer 250 over the antiparallel coupling (APC) layer 240, a dielectric barrier layer 260 over the at least one reference layer 250, at least one free layer 270 over the dielectric barrier layer 260, and a capping layer 280 over the at least one free layer 270.

The buffer layer 210 may include a titanium nitride ($TiN_x$) film having a thickness of about 8 nm and a tantalum nitride ($TaN_x$) film having a thickness of about 2 nm, wherein the tantalum nitride ($TaN_x$) film is laminated on the titanium nitride ($TiN_x$) film. The seed layer 220 may be a nickel-chromium (Ni—Cr) film having a thickness about 5 nm. The hard biasing layer 230 may include a bottom cobalt (Co) film having a thickness of about 0.3 nm and a platinum (Pt) film having a thickness of about 0.3 nm, as well as an upper Co film having a thickness of about 0.3 nm, wherein the Pt film is sandwiched between the bottom and upper Co films. The antiparallel coupling layer 240 may be an iridium (Ir) film having a thickness of about 0.5 nm. The reference layer 250 may include a cobalt (Co) film having a thickness of about 0.6 nm, a molybdenum (Mo) film having a thickness of about 0.3 nm, and an iron-boron (Fe—B) film having a thickness of about 1.0 nm, wherein the Mo film is laminated on the Co film, and the Fe—B film is laminated on the Mo film. The dielectric barrier layer 260 may be a magnesium oxide (MgO) film having a thickness of about 0.8 nm. The free layers 270 may include an iron-boron (Fe—B) film having a thickness of about 1.0 nm, a magnesium (Mg) film having a thickness of about 0.4 nm, a bottom cobalt-iron-boron (Co—Fe—B) film having a thickness of about 0.6 nm, a MgO film having a thickness of about 0.6 nm, and an upper Co—Fe—B film having a thickness of about 0.4 nm, wherein the Mg film is laminated on the Fe—B film, the bottom Co—Fe—B film is laminated on the Mg film, the MgO film is laminated on the Co—Fe—B film, and the upper Co—Fe—B film is laminated on the MgO film. The capping layer 280 may be a tungsten (W) film having a thickness of about 2 nm.

In some other embodiments, the SHE-assisted SOT-MRAM cell C(m, n) may only include a reference layer 250 over the word line WL(n), a dielectric barrier layer 260 over the reference layer 250, and a free layer 270 over the dielectric barrier layer 260 such that a magnetic tunnel junction (MTJ) is formed.

The auxiliary line SHEL(n) may include a heavy-metal layer 292 over the SHE-assisted SOT-MRAM cell C(m, n) and the interlayer dielectric layer ILD-5. In some embodiments, the heavy-metal layer 292 includes platinum (Pt), β-tantalum (Ta), β-tungsten (β-W), hafnium (Hf), iridium (Ir), osmium (Os), or alloys thereof. In some embodiments, materials having large spin orbit coupling strength have high electrical resistivity, ranging from about 150 μΩcm to about 250 μΩcm. Electrical resistivity below 150 μΩcm does not consistently produce sufficient spin-orbit coupling to flip the magnetization of the free layer. Electrical resistivity above 250 μΩcm tends to produce a strong spin-orbit coupling effect, but is associated with larger amounts of heat production and power consumption, reducing the low-power consumption and speed benefits of magnetoresistive random access memory.

The auxiliary line SHEL(n) may further include a top electrode layer 294 over the heavy-metal layer 292, wherein a dimple D is formed on the top surface of the auxiliary line SHEL(n). In some embodiments, the dimple D is formed on the top surface of the top electrode layer 294. The selector S(m, n) may be embedded in the interlayer dielectric layer ILD-6 and disposed over the auxiliary line SHEL(n) to cover the dimple D. The bit line BL(m) may be disposed over the selector S(m, n) and the interlayer dielectric layer ILD-6. Furthermore, the selector S(m, n) is disposed between and electrically coupled to the auxiliary line SHEL(n) and the bit line BL(m) such that the selector S(m, n) may be selected and turned on through a forward voltage bias applied by the auxiliary line SHEL(n) and the bit line BL(m).

The detailed process of the SHE-assisted SOT-MRAM cell C(m, n) are described in accompany with FIG. 5A through FIG. 5G.

Figure 5A:
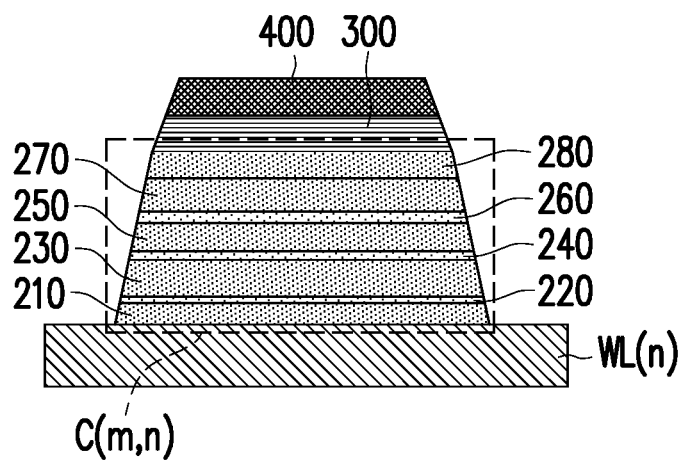
FIG. 5A through FIG. 5G are cross-sectional views for illustrating a fabricating process of the SOT-MRAM cell and the selector, in accordance with some embodiments.

Referring to FIG. 5A, an SHE-assisted SOT-MRAM cell C(m, n) is formed over the word line WL(m). In some embodiments, the SHE-assisted SOT-MRAM cell C(m, n) may be formed by sequentially depositing include a bottom electrode material layer over the word line WL(n), a seed material layer over the bottom electrode material layer, an anti-pinning material layer over the seed material layer, a spacer material layer over the anti-pinning material layer, a reference material layer over the spacer material layer, a dielectric barrier material layer over the reference material layer, a free material layer over the dielectric barrier material layer, and a keeper material over the free material layer. Then the sequentially deposited material layers are patterned through, for example, photolithography and etch processes to form the SHE-assisted SOT-MRAM cell C(m, n). In some embodiments, an etch mask is formed over the sequentially deposited material layers and the deposited material layers are patterned by at least one etch process. The etch mask may include a stopper 300 and a hard mask 400 for defining the dimension and the position of the SHE-assisted SOT- MRAM cell C(m, n). After the deposited material layers are patterned, the SHE-assisted SOT-MRAM cell C(m, n) including a bottom electrode layer 210 over the word line WL(n), a seed layer 220 over the bottom electrode layer 210, an anti-pinning layer 230 over the seed layer 220, a spacer layer 240 over the anti-pinning layer 230, a reference layer 250 over the spacer layer 240, a dielectric barrier layer 260 over the reference layer 250, a free layer 270 over the dielectric barrier layer 260, and a keeper 280 over the free layer 270 is formed over the word line WL(n). After the deposited material layers are patterned, the SHE-assisted SOT-MRAM cell C(m, n) is covered by the stopper 300 and the hard mask 400.

Figure 5B:
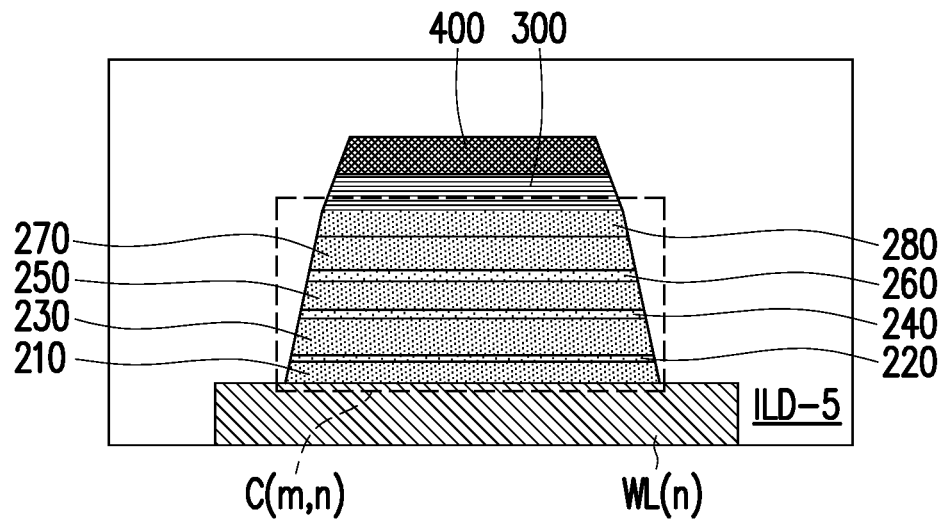
Figure 5C:
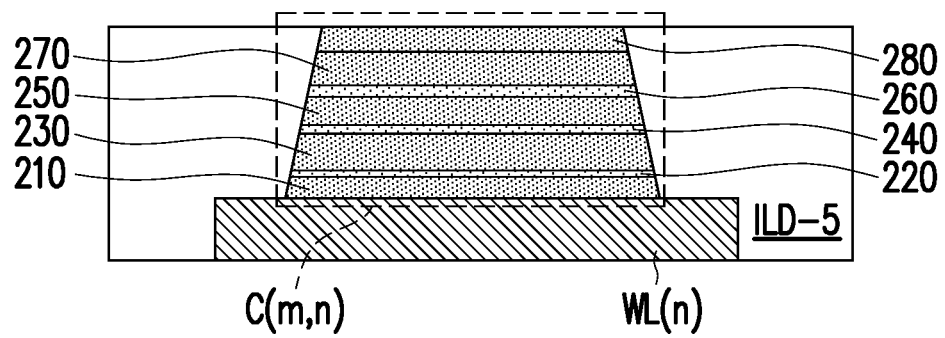

Referring to FIG. 5B and FIG. 5C, an interlayer dielectric layer ILD-5 is deposited to over the SHE-assisted SOT-MRAM cell C(m, n), the word line WL(m), the stopper 300, and the hard mask 400. Then, the interlayer dielectric layer ILD-5 is subsequently planarized, for example, by CMP and/or a recess etch until the keeper 280 of the SHE-assisted SOT-MRAM cell C(m, n) is exposed.

Figure 5D:
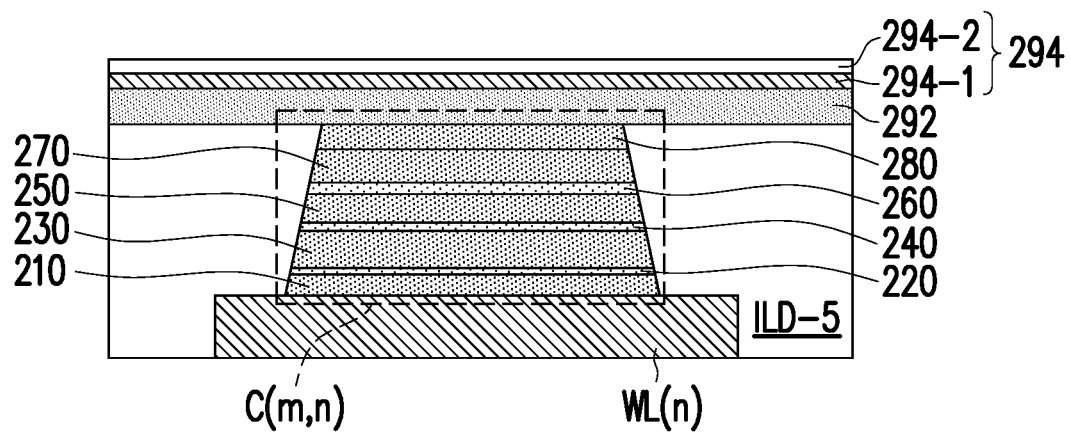

Referring to FIG. 5D, a heavy-metal layer 292 and top electrode layer 294 are sequentially formed over the SHE-assisted SOT-MRAM cell C(m, n) and the interlayer dielectric layer ILD-5. The top electrode layer 294 may include a conductive material layer 294-1 and a dielectric protection layer 294-2 over the conductive material layer 294-1. The conductive material layer 294-1 may include metallic layer(s) formed by PVD (e.g., sputtering) or CVD, and the conductive material layer 294-1 may serve as an etch stop layer for subsequently performed etch process(es). The dielectric protection layer 294-2 may include TiN, TaN, or combination thereof.

Figure 5E:
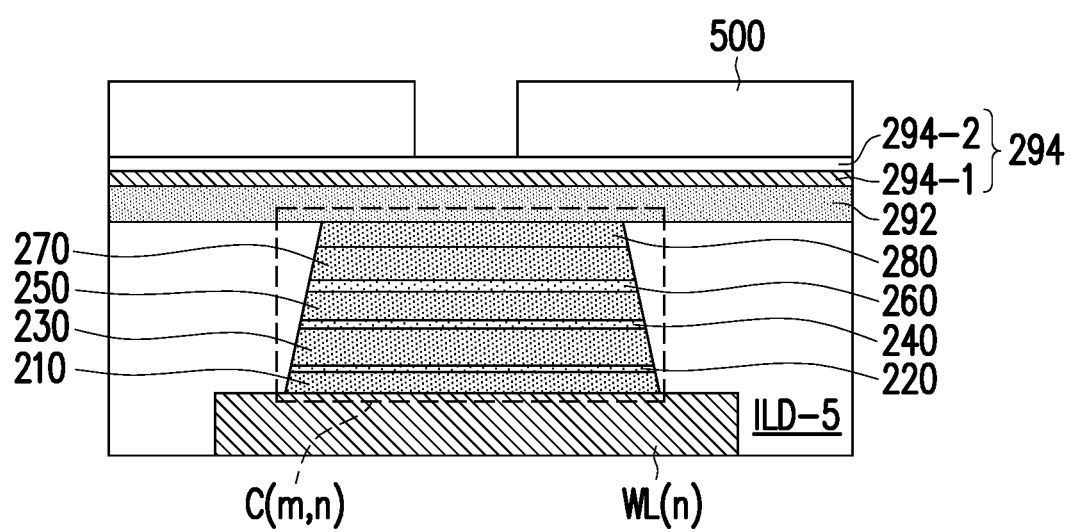
Figure 5F:
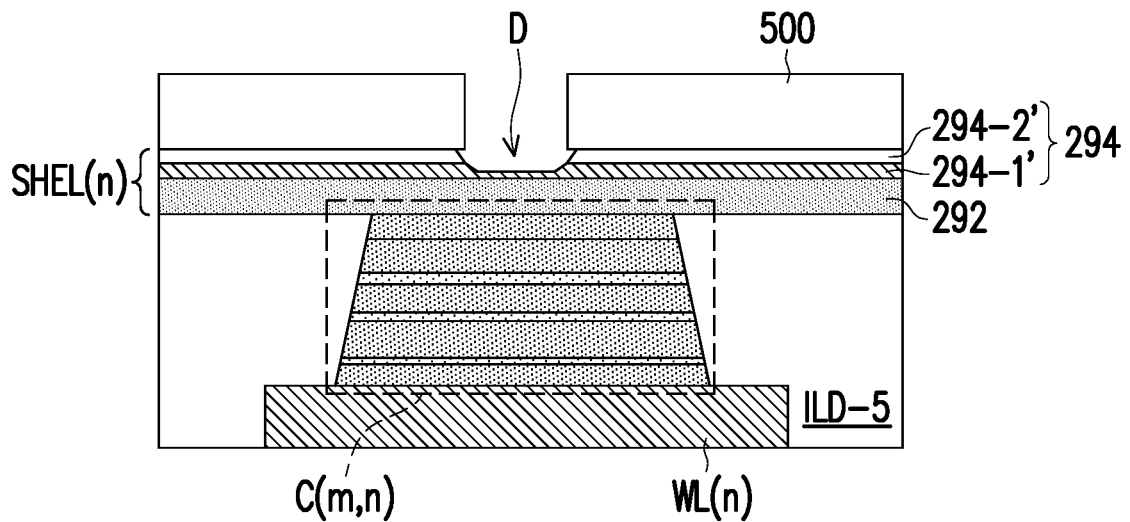

Referring to FIG. 5E and FIG. 5F, a patterned photoresist layer 500 including an opening for defining the dimension, shape and position of a dimple D is formed over the dielectric protection layer 294-2. At least one etch process is performed to partially remove the dielectric protection layer 294-2 and the conductive material layer 294-1 exposed by opening of the patterned photoresist layer 500 such that a dimple D is formed on the top surface of the top electrode layer 294. The at least one etch process is performed and stop at the conductive material layer 294-1, and the conductive material layer 294-1 protect the auxiliary line SHEL (n) from being etched and damaged.

Figure 5G:
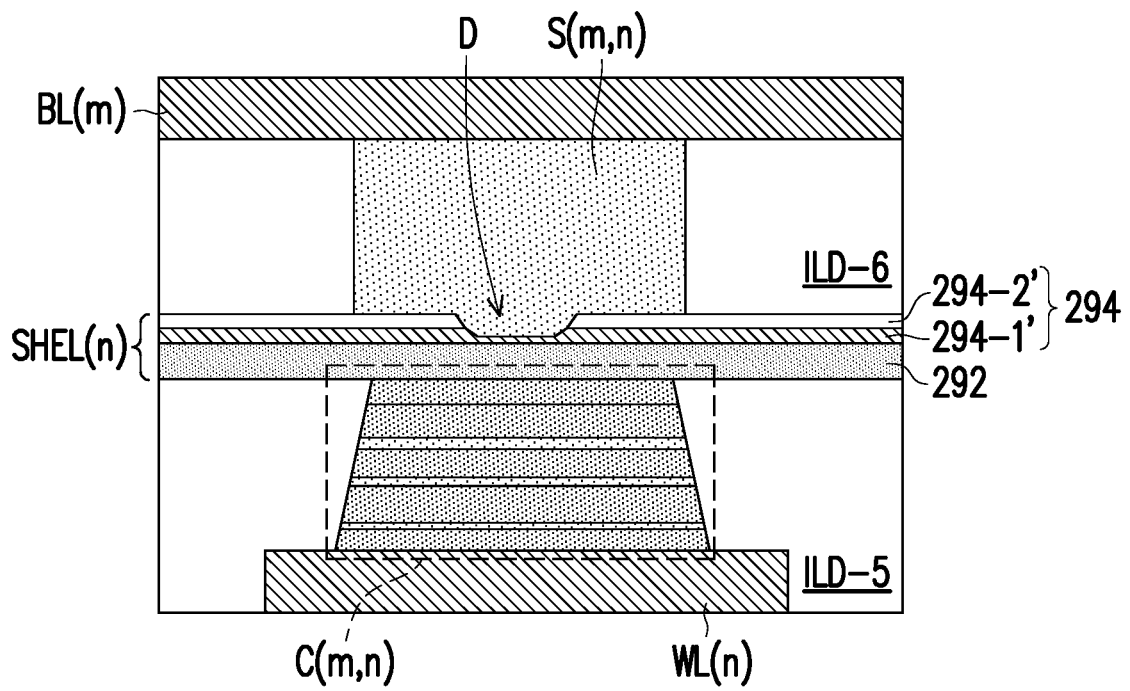

Referring to FIG. 5G, after forming the dimple D on the top surface of the top electrode layer 294, an selector S(m, n), an interlayer dielectric layer ILD-6, and a bit line BL(n) are formed. In some embodiments, the capping layer 280 and the heavy-metal layer 292 are made of the same material, such as tungsten (W). Through a "stitching" fabrication process, where the capping layer 280 are pre-cleaned with sputter-etching and then the heavy-metal layer 292 are deposited, it is expected to induce large SHE effects, thereby writing the SOT-MRAM cell effectively.

An embodiment of the present invention relates to a memory device including bit lines, word lines, auxiliary lines, selectors, and memory cells. The word lines are intersected with the bit lines. The auxiliary lines are disposed between the word lines and the of bit lines. The selectors are inserted between the bit lines and the auxiliary lines. The memory cells are inserted between the word lines and the auxiliary lines. In some embodiments, the auxiliary lines are substantially parallel with the word lines, and the auxiliary lines are intersected with the bit lines. In some embodiments, each selector among the selectors is respectively inserted between an intersection of a bit line among the bit lines and one auxiliary line among the auxiliary lines. In some embodiments, each memory cell among the memory cells is respectively inserted between a word line among the word lines and an auxiliary line among the auxiliary lines. In some embodiments, the selectors and the memory cells are spaced apart by the auxiliary lines. In some embodiments, the memory device further includes first switches, wherein the bit lines are electrically coupled to a first voltage level through the first switches. In some embodiments, the memory device further includes second switches, wherein the word lines are electrically coupled to a second voltage level through the second switches, and the second voltage level is lower than the first voltage level. In some embodiments, the memory device further includes third switches, wherein the auxiliary lines are electrically coupled to a third voltage level through the third switches, and the third voltage level is lower than the first voltage level.

Another embodiment of the present invention relates to a semiconductor die including a semiconductor substrate and an interconnect structure. The interconnect structure is over the semiconductor substrate, the interconnect structure includes an embedded memory device, and the embedded memory device includes paralleled bit lines, paralleled word lines, paralleled auxiliary lines, selectors, and memory cells. The word lines are intersected with the paralleled bit lines. The paralleled auxiliary lines are intersected with the paralleled bit lines and disposed between the paralleled word lines and the paralleled bit lines. The selectors are inserted between the paralleled bit lines and the paralleled auxiliary lines. The memory cells are inserted between the paralleled word lines and the paralleled auxiliary lines. In some embodiments, each selector among the selectors is respectively inserted between an intersection of a bit line among the bit lines and an auxiliary line among the auxiliary lines. In some embodiments, each memory cell among the memory cells is respectively inserted between a word line among the word lines and an auxiliary line among the auxiliary lines. In some embodiments, the selectors are disposed on top of the paralleled auxiliary lines, and the memory cells are disposed under the paralleled auxiliary lines. In some embodiments, the semiconductor die further includes first switches, wherein the bit lines are electrically coupled to a first voltage level through the first switches. In some embodiments, the semiconductor die further includes second switches, wherein the word lines are electrically coupled to a second voltage level through the second switches, and the second voltage level is lower than the first voltage level. In some embodiments, the semiconductor die further includes third switches, wherein the auxiliary lines are electrically coupled to a third voltage level through the third switches, and the third voltage level is lower than the first voltage level. In some embodiments, the paralleled auxiliary lines include dimples corresponding to the plurality of memory cells.

Still another embodiment of the present invention relates to a method including the followings. A magnetic tunneling junction (MTJ) is formed over a first electrode. An auxiliary line is formed over the MTJ, wherein the auxiliary line includes a Spin-Hall-Effect-assisted (SHE-assisted) layer over the MTJ and a second electrode over the SHE-assisted layer. A selector is formed over the auxiliary line. In some embodiments, the method further includes forming a dimple on a surface of the auxiliary line, wherein the selector is formed to cover the dimple. In some embodiments, the formation of the MTJ includes sequentially depositing a reference layer, a barrier layer and a free layer over the first electrode; and patterning the reference layer, the barrier layer and the free layer. In some other embodiments, the formation of the MTJ includes sequentially depositing a seed layer, an anti-pinning layer, a spacer layer, a reference layer, a barrier layer and a free layer over the first electrode; and patterning the seed layer, the anti-pinning layer, the spacer layer, the reference layer, the barrier layer and the free layer.

An alternative embodiment of the present invention relates to a memory cell including a first electrode, an auxiliary line, a magnetic tunneling junction (MTJ) disposed between the first electrode and the auxiliary line, and a selector. The auxiliary line includes a Spin-Hall-Effect-assisted (SHE-assisted) layer and a second electrode. The SHE-assisted layer is disposed between the first electrode and the second electrode. The selector is disposed on and electrically connected to the second electrode. In some embodiments, the MTJ includes a reference layer, a free layer, and a magnetic tunneling layer disposed between the reference layer and a free layer, and the free layer is disposed between the magnetic tunneling layer and the SHE-assisted layer. In some embodiments, the auxiliary layer includes a dimple for SHE-effect enhancement. In some embodiments, the second electrode includes a dimple for SHE-effect enhancement.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
first conductive lines;
second conductive lines spaced apart from the first conductive lines;
auxiliary lines between the first conductive lines and the second conductive lines, wherein the auxiliary lines are substantially parallel with the second conductive lines, and the auxiliary lines are intersected with the first conductive lines;
selectors electrically coupled between the first conductive lines and the auxiliary lines; and
memory cells electrically connected between the second conductive lines and the auxiliary lines, wherein the selectors are disposed at a first side of the auxiliary lines, and the memory cells are disposed at a second side of the auxiliary lines, and the second side is opposite to the first side.

2. The memory device according to claim 1, wherein the memory cells are in contact with the second conductive lines.

3. The memory device according to claim 2, wherein each selector among the selectors is respectively disposed between an intersection of a first conductive line among the first conductive lines and an auxiliary line among the auxiliary lines.

4. The memory device according to claim 3, wherein each memory cell among the memory cells is respectively disposed between a second conductive line among the second conductive lines and an auxiliary line among the auxiliary lines.

5. The memory device according to claim 1, wherein the selectors and the memory cells are spaced apart by the auxiliary lines.

6. The memory device according to claim 1 further comprising first switches, wherein the first conductive lines are electrically coupled to a first voltage level through the first switches.

7. The memory device according to claim 6 further comprising second switches, wherein the second conductive lines are electrically coupled to a second voltage level through the second switches, and the second voltage level is lower than the first voltage level.

8. The memory device according to claim 6 further comprising third switches, wherein the auxiliary lines are electrically coupled to a third voltage level through the third switches, and the third voltage level is lower than the first voltage level.

9. A semiconductor die, comprising:
a semiconductor substrate;
an interconnect structure disposed over the semiconductor substrate, the interconnect structure comprising:
bit lines;
word lines;
auxiliary lines;
a first dielectric layer between the bit lines and the auxiliary lines;
a second dielectric layer between the word lines and the auxiliary lines;
selectors disposed between the bit lines and the auxiliary lines, and the selectors being embedded in the first dielectric layer; and
memory cells disposed between the word lines and the auxiliary lines, the memory cells being embedded in the second dielectric layer.

10. The semiconductor die according to claim 9, wherein each selector among the selectors is respectively disposed between an intersection of a bit line among the bit lines and an auxiliary line among the auxiliary lines.

11. The semiconductor die according to claim 10, wherein each memory cell among the memory cells is respectively disposed between a word line among the word lines and an auxiliary line among the auxiliary lines.

12. The semiconductor die according to claim 9, wherein the selectors are disposed on top of the auxiliary lines, and the memory cells are disposed under the auxiliary lines.

13. The semiconductor die according to claim 9 further comprising first switches, wherein the bit lines are electrically coupled to a first voltage level through the first switches.

14. The semiconductor die according to claim 13 further comprising second switches, wherein the word lines are electrically coupled to a second voltage level through the second switches, and the second voltage level is lower than the first voltage level.

15. The semiconductor die according to claim 13 further comprising third switches, wherein the auxiliary lines are electrically coupled to a third voltage level through the third switches, and the third voltage level is lower than the first voltage level.

16. The semiconductor die according to claim 9, wherein the auxiliary lines comprise dimples corresponding to the memory cells.

17. A memory device, comprising:
- an auxiliary line comprising a first surface, a second surface opposite to the first surface, and a dimple on the first surface;
- a bit line and a word line respectively disposed at opposite sides of the auxiliary line;
- a selector disposed on the first surface of the auxiliary line and located between the bit line and the auxiliary line; and
- a memory cell disposed on the second surface of the auxiliary line and located between the word line and the auxiliary line.

18. The memory device according to claim 17, wherein the selector is in contact with and electrically coupled to the auxiliary line.

19. The memory device according to claim 17, wherein the selector is in contact with and electrically coupled to the auxiliary line and the bit line.

20. The memory device according to claim 17, wherein the dimple is covered by the selector.

\* \* \* \* \*